(12) United States Patent
Wiesinger et al.

(10) Patent No.: US 8,217,651 B2
(45) Date of Patent: Jul. 10, 2012

(54) AMPLIFIED RADIATION DAMPING FOR MR IMAGING AND SPECTROSCOPY

(75) Inventors: Florian Wiesinger, Freising (DE); Christopher Judson Hardy, Schenectady, NY (US); Thomas Kwok-Foo, Clifton Park, NY (US)

(73) Assignee: General Electric Company, Niskayuna, NY (US)

( * ) Notice: Subject to any disclaimer, the term of this patent is extended or adjusted under 35 U.S.C. 154(b) by 399 days.

(21) Appl. No.: 12/638,491

(22) Filed: Dec. 15, 2009

(65) Prior Publication Data

US 2011/0101979 A1    May 5, 2011

Related U.S. Application Data

(60) Provisional application No. 61/256,941, filed on Oct. 30, 2009.

(51) Int. Cl.
*G01V 3/00* (2006.01)
(52) U.S. Cl. .................................................... 324/309
(58) Field of Classification Search ............ 324/300–322
See application file for complete search history.

(56) References Cited

U.S. PATENT DOCUMENTS 5,767,677 A    6/1998  Anderson

OTHER PUBLICATIONS

P. Broekaert et al., "Suppression of Radiation Damping in NM-64.R in Liquids by Active Electronic Feedback," Journal of Magnetic Resonance, Series A, vol. 113, 1995, pp. 60-64.
P. Kellman et al., "Phase-Sensitive Inversion Recovery for Detecting Myocardial Infarction Using Gadolinium-Delayed Hyperenhancement," Magnetic Resonance in Medicine, vol. 47, 2002, pp. 372-383.
R.F. Busse et al., "Fast Spin Echo Sequences With Very Long Echo Trains: Design of Variable Refocusing Flip Angle Schedules and Generation of Clinical T2 Contrast," Magnetic Resonance in Medicine, vol. 55, 2006, pp. 1030-1037.
D. Abergel et al., "Amplification of radiation damping in a 600-MHz NMR spectrometer: Application to the study of water-protein interactions," Journal of Biomolecular NMR, vol. 8, 1996, pp. 15-22.
A. Louis-Joseph et al., "Neutralization of radiation damping by selective feedback on a 400 MHz NMR spectrometer," Journal of Biomolecular NMR, vol. 5, 1995, pp. 212-216.
F. Wiesinger et al, "Balanced Steady-State Feedback Radiation Damping: Balanced SSFR", Proc. Intl. Soc. Mag. Reson. Med. Apr. 17, 2009, p. 2655.
F. Wiesinger et al, "Signal recovery based on active radiation damping feedback", ESMRMB 2009 Congress, Antalya, Turkey, Oct. 1-3: Abstracts, Magnetic Resonance Materials in Physics, Biology and Medicine, vol. 22, Supplement 1, Oct. 2009.
Sy Huang et al, 'Accelerated Radiation Damping for Increased Spin Equilibrium (ARISE): A New Method for Controlling the Recovery of Longitudinal Magnetization', MRM 60: 1112-1121 (2008) Published Online: Oct. 27, 2008.
Sy Huang et al, 'Sensitivity of feedback-enhanced MRI contrast to macroscopic and microscopic field variations', MRM 61: 925-936 (2009) Published Online: Feb. 4, 2009.
S Datta et al, 'Contrast Enhancement by Feedback Fields in Magnetic Resonance Imaging', J. Phys. Chem. B 110: 22071-22078 (2006) Publication Date (Web): May 28, 2006.

*Primary Examiner* — Dixomara Vargas
(74) *Attorney, Agent, or Firm* — Scott J. Asmus

(57) ABSTRACT

An imaging system including an imaging apparatus having a plurality of coils, wherein an imaging target is at least partially disposed proximate the coils with at least one excitation source providing pulse sequences. A switch switchably connects the pulse sequences from the excitation source to the coils and switchably connecting to spatially encoded images from the coils during data acquisition. There is an amplified radiation damping feedback section providing amplified radiation damping feedback to the imaging target, wherein the amplified radiation damping feedback provides recovery of longitudinal magnetization subsequent to the data acquisition, and a receiver section for processing the spatially encoded images.

21 Claims, 13 Drawing Sheets

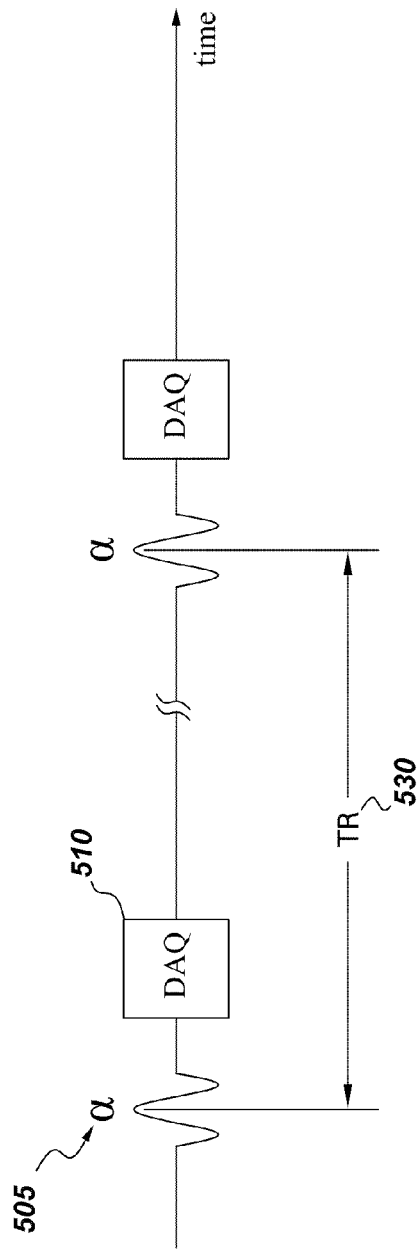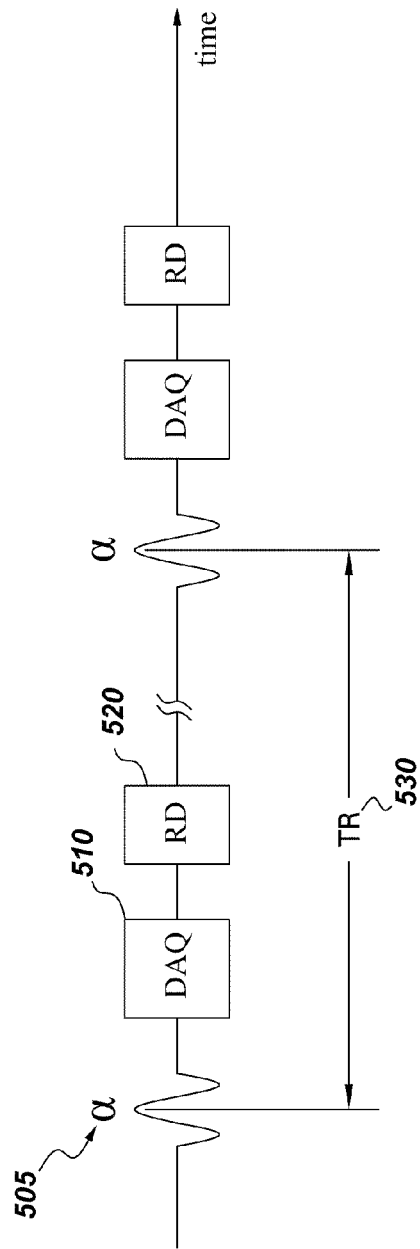

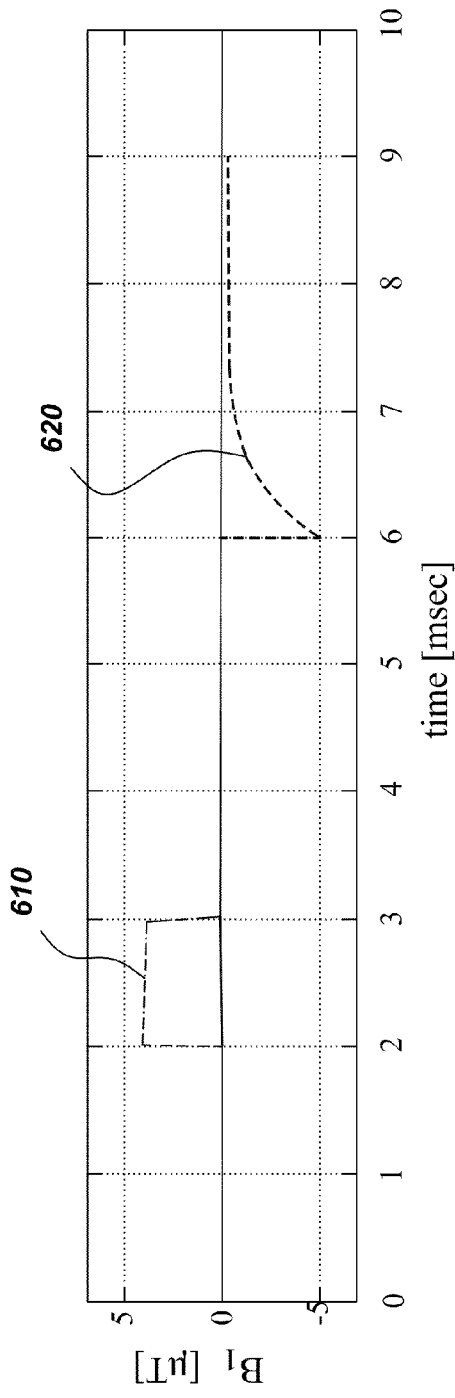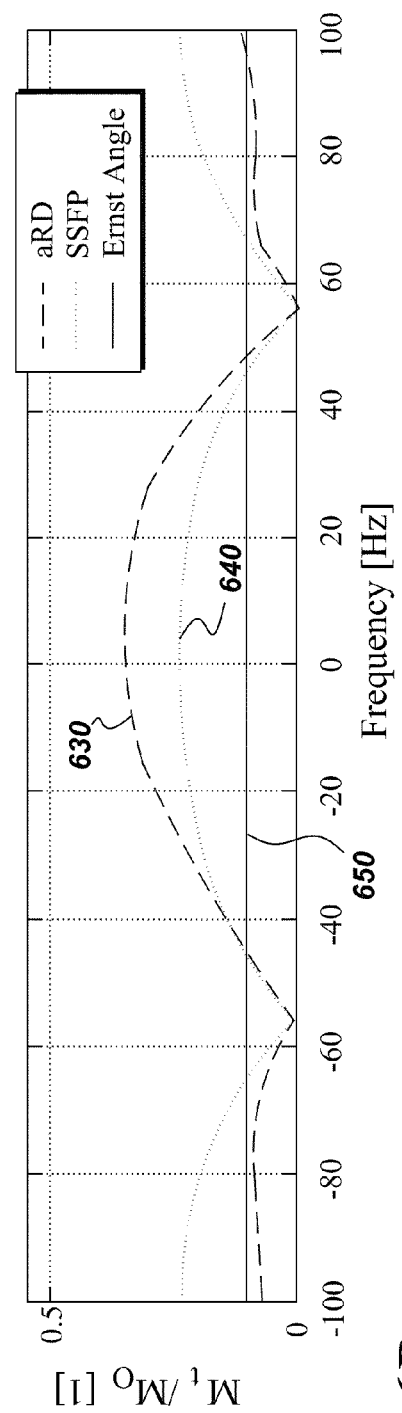
Fig. 6A
Fig. 6B

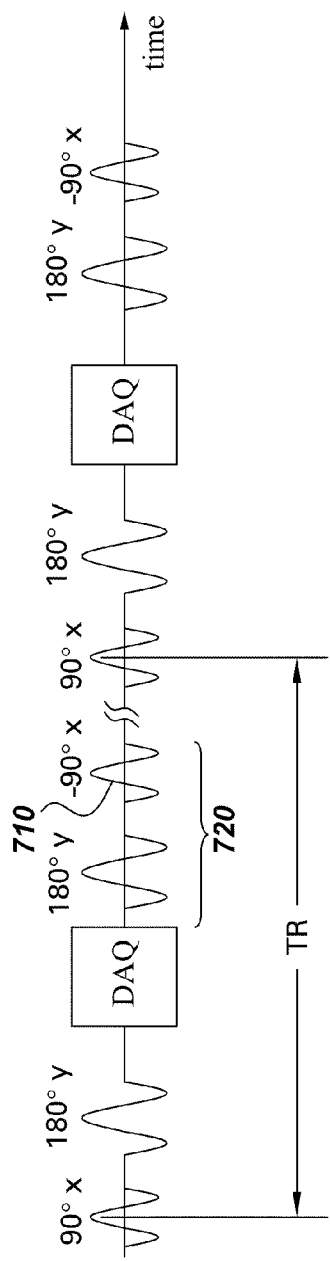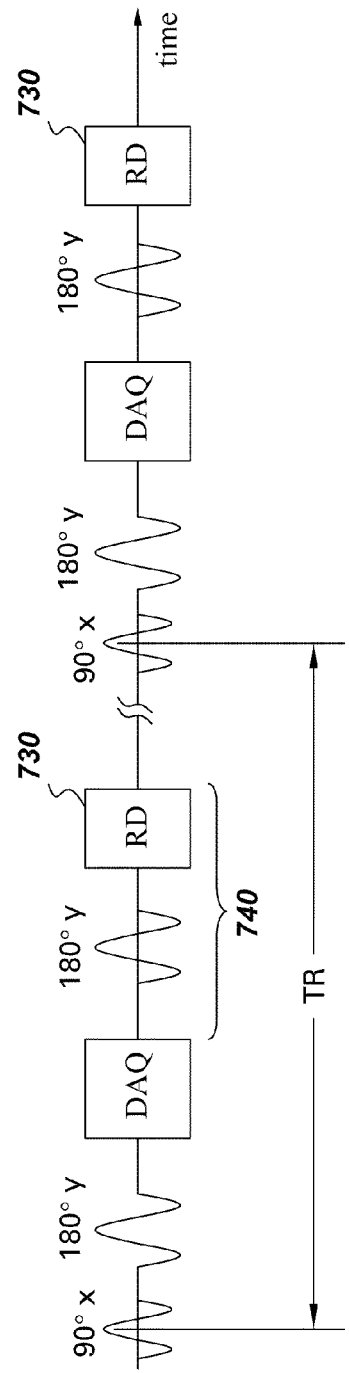
Fig. 7A
Fig. 7B

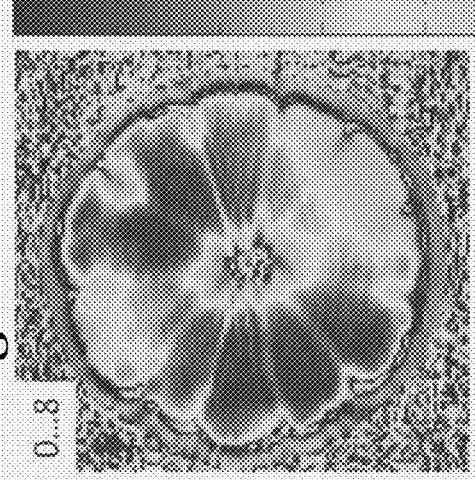
*Fig. 13C*
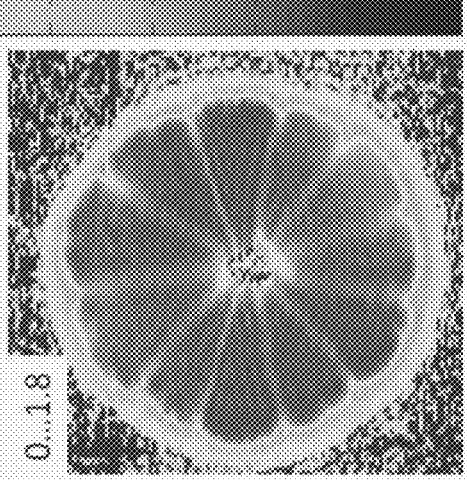
*Fig. 13F*
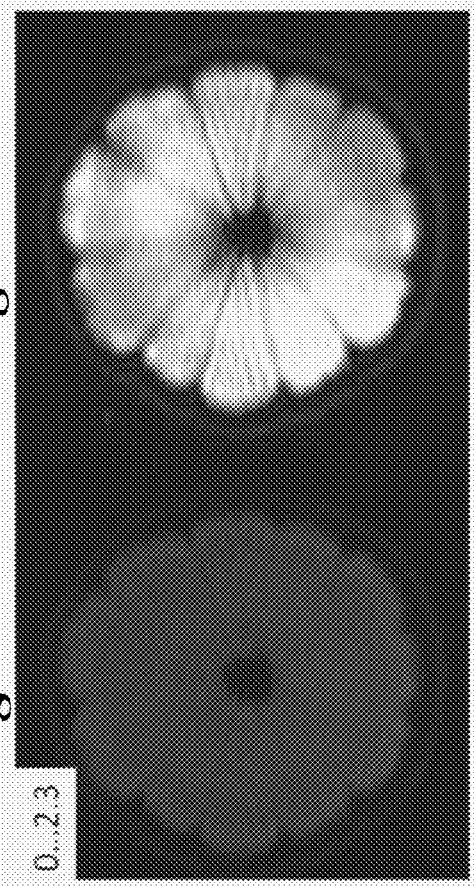
*Fig. 13B*
*Fig. 13A*
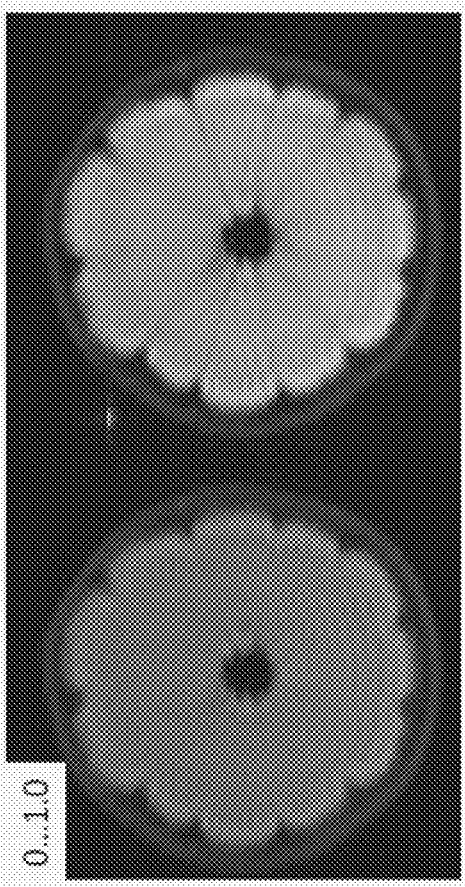
*Fig. 13E*
*Fig. 13D*

AMPLIFIED RADIATION DAMPING FOR MR IMAGING AND SPECTROSCOPY

CROSS REFERENCE TO RELATED APPLICATIONS

This application claims the benefit of U.S. Provisional Application No. 61/256,941, filed Oct. 30, 2009, which is herein incorporated in its entirety by reference.

BACKGROUND

A magnetic resonance (MR) imaging system provides an image of at least a portion of a patient, animal or object in an imaging volume based on detected radio frequency (RF) signals from precessing nuclear magnetic moments. In general operation, a main magnet produces a static magnetic field over the imaging volume and gradient coils within the MR imaging system are used to quickly switch to effect magnetic gradients along mutually orthogonal x, y, z coordinates in the static magnetic field during selected portions of an MR imaging data acquisition cycle. There is also an RF coil that produces RF magnetic field pulses perpendicular to the static magnetic field, within the imaging volume to excite the nuclei. The nuclei are thereby excited to precess about an axis at a resonant RF frequency. As the precession occurs into the transverse plane, the transverse component of magnetization is magnetically coupled to some external circuitry, typically a receiver. The transmitter and receiver coupling mechanisms are typically referred to as RF coils.

For a typical multi-nuclei scanner, the RF coils and corresponding amplifiers receive excitation pulses from a respective transmitter that is configured to generate a plurality of excitation pulses in a spectrum around the resonance frequency of a particular isotope. During excitation, pulses from an associated amplifier energize the respective RF coil, which is frequency-tuned to the particular isotope of interest within the subject. During data readout, a switch connects the RF coil to a receiver so that MR signals generated from precessing nuclei within the subject are received by the RF coil and conveyed to the receiver. The acquired MR signals are processed to produce one or more images of the subject.

Natural radiation damping (RD) occurs when the nuclear magnetic resonance (NMR) signal induced in a receiver coil is strong enough to generate a significant RF magnetic field acting back on the spins. According to Lenz's law, the RD field acts in a way to oppose its original cause. In that sense, it is understood as a self-regulating flip-back pulse causing the transverse magnetization to return to equilibrium more rapidly than it otherwise would, such as described in Bloembergen N, Pound R V; "Radiation Damping in Magnetic Resonance Experiments", Physical Review 1954; 95(1):8-12. The return to equilibrium occurs at a characteristic rate distinct from tissue-specific relaxation times. The RD phenomenon has been demonstrated for frequency-dependent contrast. This is further explained in Huang S, Chung A L, Y.; "Visualizing Feedback-Enhanced Contrast in Magnetic Resonance Imaging"; Concepts in Magnetic Resonance Part A 2007; 30A(6):378-393.

For clinical MRI scanners operating at 1.5 or 3 T, the coil quality-factor (Q) and the filling-factor ($\eta$) of standard RF coils are insufficient to induce a significant intrinsic RD field. Typically, signals are sufficiently strong to produce RD only in very high quality-factor (Q) coils with high filling-factors ($\eta$), such as in high-resolution NMR spectrometers. Recently, actively controlled amplified radiation damping (ARD) feedback loops have been introduced into the transmit-receive signal path as a means to either cancel or amplify the RD field, in the context of high-resolution NMR, or MRI systems.

Certain applications for canceling the RD field are described in Broekaert P, Jeener J.; "Suppression of radiation damping in NMR in liquids by active electronic feedback"; Journal of Magnetic Resonance, 1995; 113:60-64 and Louis-Joseph A A, D., Lallemand J Y.; "Neutralization of radiation damping by selective feedback on a 400 MHz NMR spectrometer"; Journal of Biomolecular NMR 1995; 5:212-216.

Certain applications for amplifying the RD field are detailed in Abergel D, Louis-Joseph A L, J. Y, "Amplification of radiation damping in a 600 MHz NMR spectrometer"; Journal of Biomolecular NMR 1996; 8:15-22; and Huang S Y, Witzel T, Wald L L. "Accelerated radiation damping for increased spin equilibrium (ARISE): a new method for controlling the recovery of longitudinal magnetization"; Magnetic Resonance Medicine, 2008; 60(5):1112-1121.

The signal-to-noise ratio (SNR) efficiency in MR experiments is intrinsically limited by longitudinal and transverse spin relaxation mechanisms. This becomes particularly limiting for short-repetition-time (TR) pulse sequences, where incomplete T1-relaxation results in a steady-state signal that is only a small fraction of the available thermal equilibrium magnetization. In comparison, fast recovery and steady-state free-precision (SSFP) are known to be among the most SNR efficient pulse sequences, as explained in Bernstein M A, King K F, Zhou X J; "Handbook of MRI Pulse Sequences"; Elsevier Academic Press 2004. Fast recovery sequences restore remaining transverse magnetization by rotating it back to the longitudinal direction. SSFP uses signal refocusing and RF phase cycling to recycle the magnetization efficiently with relatively high flip angles and fast repetition. Both fast recovery and SSFP methods are susceptible to various imperfections (i.e. off-resonance effects, flip-angle misscalibration, transient effects, undesired refocusing echoes, etc.) and are therefore demanding in terms of robust implementation.

While there have been a variety of efforts to implement ARD feedback schemes, there continue to be unfavorable characteristics in the state of the art that remain unresolved. In particular, previously presented ARD feedback schemes are generally limited in terms of flexibility and their ability to achieve adequate feedback gain.

BRIEF DESCRIPTION

The present system relates generally to medical imaging such as magnetic resonance (MR) imaging and spectroscopy. More particularly, it relates to amplified radiation damping (ARD) use for medical imaging.

One embodiment is an imaging system including an imaging apparatus having a plurality of coils, wherein an imaging target is at least partially disposed proximate the coils. There is at least one excitation source providing pulse sequences, such as MR sequences, wherein a switch switchably connects the pulse sequences from the excitation source to the coils and switchably connects to spatially encoded signals from the coils during data acquisition. A feedback section provides amplified radiation damping feedback to the imaging target, wherein the amplified radiation damping feedback provides recovery of longitudinal magnetization subsequent to the data acquisition. There is also a receiver section for processing the spatially encoded signals.

The feedback section in one example has at least one amplifier and at least one attenuator and at least one phase shifter, and strength and phase of the amplified radiation damping feedback is respectively controlled within certain limits by the attenuator and phase shifter.

In another example the pulse sequences are gradient-echo pulse sequences or spin-echo pulse sequences and used for physiologically-triggered or hyperpolarized MR imaging and spectroscopy. The pulse sequences may include balanced gradient waveforms and the radiation damping feedback is applied after the data acquisition and the balancing gradient waveforms. The pulse sequences may include at least one refocusing pulse, wherein the refocusing pulse and the amplified radiation damping feedback are applied at the corresponding echo formation. The amplified radiation damping feedback in one aspect is time-selectively activated and adjusted under pulse sequence control.

Another embodiment is an imaging method using amplified radiation damping, providing excitation pulses to transmit coils in an imaging system, creating $B_1$ fields with the transmit coils to nutate nuclear magnetization of a target and causing the nuclei to precess, acquiring image signals of the target from RF receive coils during a data acquisition, acquiring refocused signals of the target from the receive coils after data acquisition, selectively processing the refocused signals and applying amplified radiation damping feedback for recovering longitudinal magnetization after the data acquisition thereby providing improved image signals, and generating images from the improved image signals.

The imaging system in one example is a transmit-receive quadrature birdcage, operating one quadrature mode in a transmit-receive operation and another quadrature mode in a radiation damping feedback operation.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

BRIEF DESCRIPTION OF THE DRAWINGS

These and other features, aspects, and advantages will become better understood when the following detailed description is read with reference to the accompanying drawings in which like characters represent like parts throughout the drawings, wherein:

FIGS. 5a and 5b illustrate gradient-echo imaging without (FIG. 5a) and with (FIG. 5b) ARD feedback;

FIGS. 6a and 6b compares simulated steady-state signal response for gradient-echo imaging incorporating ARD feedback, steady-state free precession (SSFP), and spoiled gradient-echo imaging with Ernst angle excitation;

FIGS. 7a and 7b; shows the spin-echo pulse sequence for fast recovery (FIG. 7a) and ARD feedback recovery (FIG. 7b);

FIG. 13 illustrates increased contrast and SNR efficiency for gradient-echo ARD (using the ARD feedback circuit of FIG. 12) when compared with standard GRE imaging.

DETAILED DESCRIPTION

Figure 1:
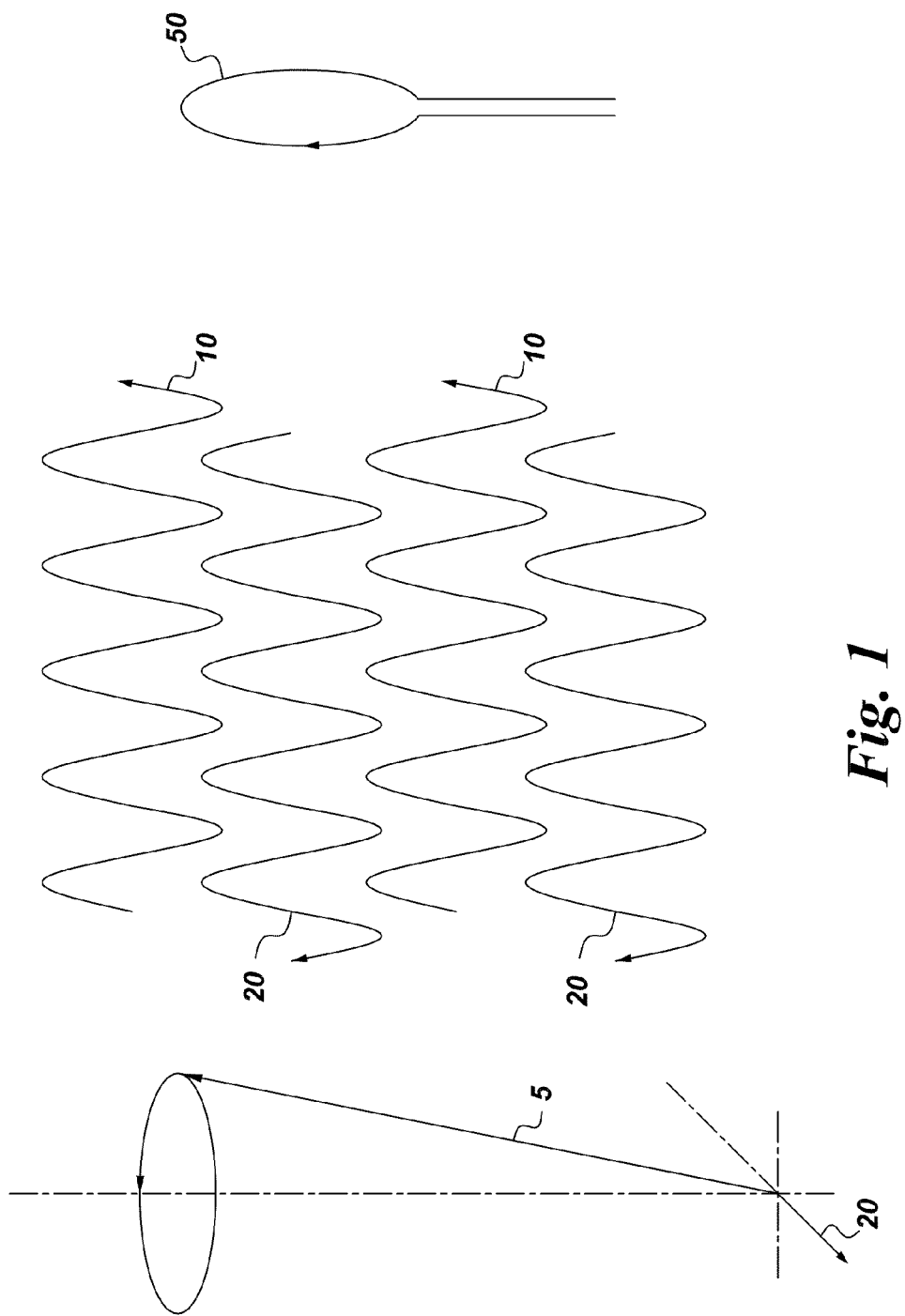
FIG. 1 shows a prior art illustration of the radiation damping effect.

In the following detailed description, numerous specific details are set forth in order to provide a thorough understanding of various embodiments of the present system and methods of operation. However, those skilled in the art will understand that embodiments may be practiced without these specific details, that the present system is not limited to the depicted embodiments, and that the present system may be practiced in a variety of alternative embodiments. In other instances, well known methods, procedures, and components have not been described in detail.

Furthermore, various operations may be described as multiple discrete steps performed in a manner that is helpful for understanding embodiments of the present system. However, the order of description should not be construed as to imply that these operations need to be performed in the order that they are presented, nor that they are even order dependent. Moreover, repeated usage of the phrase "in one embodiment" does not necessarily refer to the same embodiment, although it may. Lastly, the terms "comprising", "including", "having", and the like, as well as their inflected forms as used in the present application, are intended to be synonymous unless otherwise indicated.

One embodiment involves using ARD as a general signal recovering mechanism. As such, it can be applied in diverse applications, such as increasing the SNR efficiency and/or spin density contrast and/or T2 contrast of short-TR sequences, recycling transverse magnetization in hyperpolarized applications, and stabilizing signal variations in physiologically-triggered sequences.

Since the early nineties, various actively controlled ARD feedback loops have been described that are used to manipulate the ARD effect and steer it in certain directions. According to one embodiment, a dedicated feedback circuit diverts the incoming received signal and couples it back into the primary transmit coil via appropriate conditioning of the received signal (i.e. amplification, phasing and filtering). The feedback circuit thus allows precise control of the ARD effect.

One embodiment of the present system is a novel ARD feedback scheme based on a quadrature birdcage coil. One of the two birdcage quadrature modes is used for standard transmit-receive, whereas the other one is reserved for ARD feedback. The inherent decoupling between the two quadrature modes minimizes direct, transmit-receive interactions during ARD active time zones or periods. Another implementation uses quadrature excitation and quadrature signal detection for normal transmit receive operation. This implementation uses the two modes independently only for ARD active time zones. Such a switching is permissible because the ARD feedback does not occur at the same time as normal transmit receive. In this way the SAR and SNR advantages of quadrature excitation and signal detection would still be maintained without affecting the ARD feedback.

One aspect of the system is that the ARD feedback is applied after image data acquisition. More specifically, the ARD effect is used to recover remaining longitudinal magnetization after data acquisition is finished. In order to maximize the ARD input receive signal, gradient waveforms are designed to be balanced at RD-feedback-active time zones. This concept is applicable for both gradient-echo (GRE) and spin-echo (SE) type sequences. For GRE sequences, the ARD feedback is applied directly after image data acquisition (plus subsequent balancing gradients). SE-based ARD uses an additional refocusing pulse and the ARD feedback pulse is then applied around the corresponding spin echo.

FIG. 1 provides a simplified prior art illustration of the RD effect, wherein the MR signal detection is based on Faraday induction of the RF fields emitted by precessing magnetization. The corresponding signal current in the receiver coil causes a secondary, so-called radiation damping (RD) field, which in turn acts back onto the spin system.

In more particular detail, the precessing magnetization $o$ 5 cause a primary $B_1$ RF field 10 that gets detected by the RF receiver coil 50. The induced current in turn generates a secondary $B_1$ RD field 20, which acts back onto the spin system. According to Lenz's law, the RD field acts in a way to oppose its original cause and thereby accelerates the return of the transverse magnetization towards the longitudinal direction.

In that sense, it can be understood as a self-generating and self-regulating flip-back pulse causing the transverse magnetization to return to equilibrium more rapidly than it otherwise would. The effect is characterized by the RD time constant $\tau_{RD}$ according to:

$$\tau_{RD} = \frac{2}{\gamma \mu_0 \eta Q M_0}$$

where $\gamma$ is the gyromagnetic ratio, $\mu_0$ the magnetic permeability of the vacuum, $\eta$ the coil filling factor, $Q$ the coil quality factor and $M_0$ the thermal equilibrium magnetization.

Generally, signals are sufficiently strong to produce a significant RD effect only in very high-Q coils with high filling factors, such as in high-resolution NMR spectrometers. Conversely, under normal in-vivo human MR conditions the natural RD effect is typically negligible.

In one example, actively controlled ARD feedback loops introduced into the transmit-receive signal path act as a means to either cancel or amplify the ARD field. With such ARD feedback loops, the ARD gain and phase are flexibly controlled. In particular, the ARD effect can be used to recover transverse magnetization into the longitudinal direction. In that sense, amplified radiation damping (ARD) can be applied as a tool to significantly boost SNR efficiency in MR imaging and spectroscopy. In addition ARD feedback is also known to enhance image contrast such as explained in Susie Y. Huang, et al, Designing feedback-based contrast enhancement for in vivo imaging, Magn. Reson. Mater. Phy. (2006) 19: 333-346 and Susie Y. Huang, et al, Magnetic Resonance in Medicine 61: 925-936 (2009).

Figure 2:
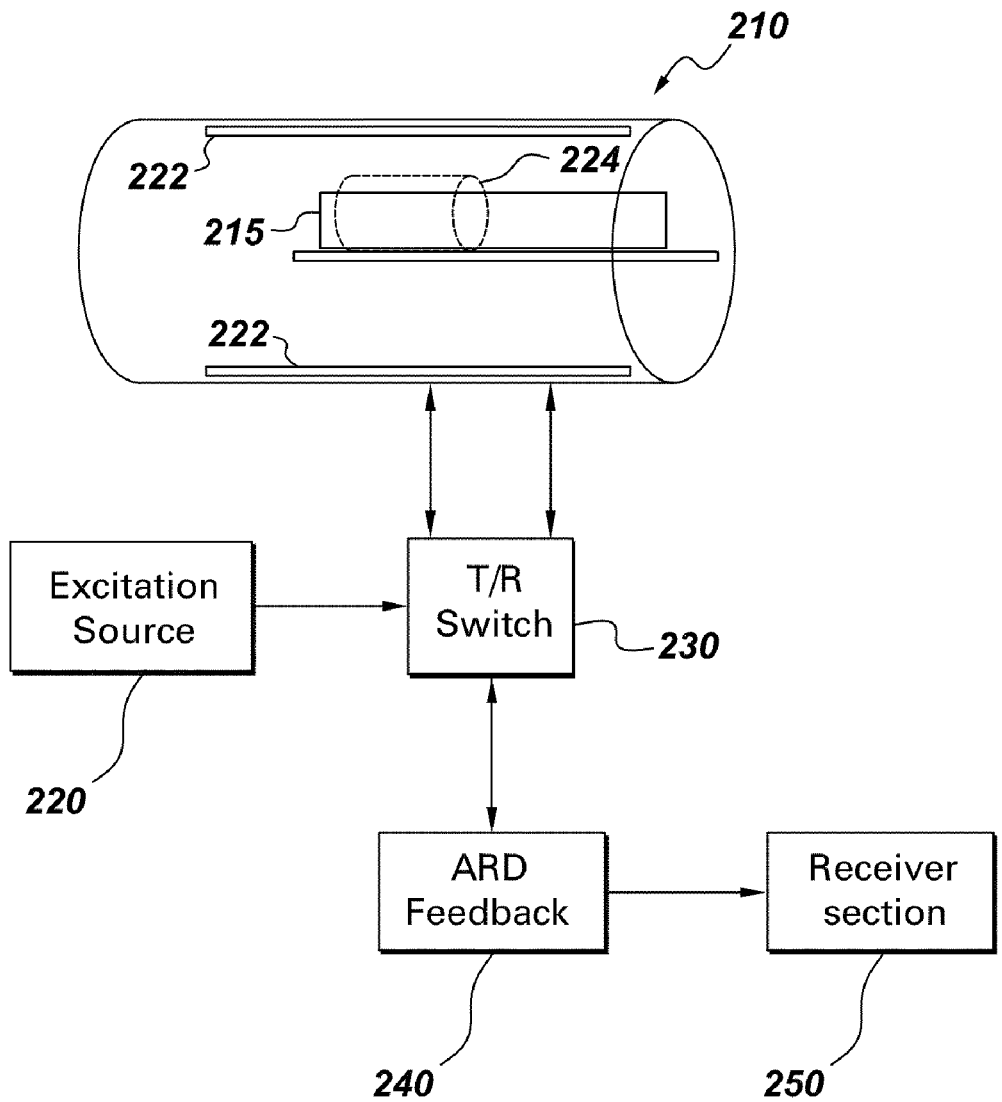
FIG. 2 is a system perspective illustration of ARD in one embodiment.

Referring to FIG. 2, a general description is provided for an imaging system 200 that excites multiple nuclei within a subject/object 215. The system 200 allows a subject 215 such as a human, animal, or baggage to be at least partially disposed within a bore of the imaging apparatus 210 for one or more imaging procedures. For convenience, the various objects, persons or animals that are subject to scanning will be termed targets. The imaging procedures may include spin echo, gradient echo, stimulated echo, or a combination thereof.

In operation, a magnet, such as a superconducting magnet, resistive magnet, or permanent magnet typically produces a stationary and substantially homogeneous main magnetic field $B_0$ in the subject/object. The nuclei within the target align in a parallel and/or an anti-parallel direction with respect to the magnetic flux lines of the magnetic field $B_0$. Magnetic field gradient coils are disposed in the system, wherein the gradient coils superimpose various magnetic field gradients G on the magnetic field $B_0$ in order to define an imaging slice or volume and to otherwise spatially encode excited nuclei. The magnetic field gradient coils typically produce orthogonal magnetic field gradients such as $G_z$, $G_y$, and/or $G_x$ gradients in a Cartesian plane. These gradients correspond to a set of axes defining a volume of the target and enable spatial information to be obtained. The corresponding image data signals are produced by switching gradient fields in a controlled sequence typically by a gradient controller.

The excitation source 220 is used to generate the single and/or multi-nuclei excitation pulses and provides these pulses to the RF coils 222, 224, typically through an amplifier and a switch 230. The excitation source 220 includes at least one transmitter associated with one or more signal generators that generate the excitation pulses for a defined frequency range corresponding to a resonance frequency of each selected isotope along with a frequency spread corresponding to the applied gradients.

In general, RF coils create the $B_1$ field that rotates the net magnetization in a pulse sequence. RF coils are divided into three general categories, namely transmit/receive coils, receive-only coils, and transmit-only coils. Transmit/receive coils serve as the transmitter of the $B_1$ fields and the receiver of RF energy from the imaged target. A transmit-only coil is used to create the $B_1$ field and a receive-only coil is used to receive the signal from the spins in the imaged object. There can be various RF coils such as a full body coil 222, a local coil 224, and/or one or more surface coils that can be deployed in the system. Furthermore, each of the coils 222, 224 can be tuned for a single isotope or multiple isotopes. For convenience, the RF coils that create the B1 fields will generally be considered transmit coils and the RF coils that receive the MR signals from the target will be termed imaging coils.

The excitation pulses create a magnetic field $B_1$ via the RF coils that is perpendicular to $B_0$, which displaces the magnetization of the nuclei of the target 215, causing the nuclei to precess at a frequency determined by the field strength. There is typically a scanner controller that controls the excitation source that is based on operator instructions or computer control. The scanner controller also typically controls the switch 230 for the excitation pulses from the excitation source to the coils. During the excitation phase, the switch 230 allows the excitation pulses to pass to the RF transmit coils 222, 224, but not to a receiver section 250. Upon receiving the excitation pulses, the RF transmit coils 222, 224 resonate and apply the pulses into the imaging region of the target 215. Thus, in one example the switch 230 switchably connects to the excitation source 220 during the transmit mode and to the receiver 250 for the receive mode and to the ARD feedback section 240 during the ARD active time zone.

As the nuclei precess back to an equilibrium state, magnetic resonance signals are emitted that are detected by receive coils 222/224. The switch 230 also connects to the one or more receive coils 222/224 to acquire the spatially encoded MR signals during the readout phase. There are many different types of receive coils 222/224, however for purposes of illustration, the present embodiment will employ transmit/receive RF coils that are able to transmit as well as receive the signals and operate as receive coils. There can be separate receive coils for each isotope or one or more multi-tuned receive coils used for multiple isotopes. There can be a plurality of receive coils each tuned to receive a MR signal at a frequency associated with a particular isotope, a plurality of receive coils sharing a transmission line and each tuned to receive a MR signal at a frequency associated with a particular isotope; and/or one or more receive coils tuned to receive MR signals at multiple frequencies, each frequency corresponding to a different isotope.

In one embodiment, the received MR signals from the RF coils 222, 224 are communicated through the switch 230 and into the ARD feedback section 240 and to the receiver section 250. It should be noted that in one example the ARD feedback section 240 is time-selectively activated such that, during selected non-activated periods, the received MR signals can pass through to the receiver 250 without being subject to the ARD processing. According to one example, the time-selectively activated ARD can be active at any point in the pulse sequence, and be used to apply the ARD to the imaging target 215 via the coils 222, 224. The ARD feedback acts upon the imaging target 215 to increase the SNR efficiency and/or enhance the image contrast.

The ARD feedback section in the context of MR pulse sequences (either GRE, or SE version) as a general concept enables the recovery of longitudinal magnetization. The ARD concept is compatible with the application of specific gradient and/or RF preparation pulses (e.g. inversion pulses or saturation pulses). Hence, ARD can be used to increase the SNR and/or time efficiency of MR imaging and spectroscopy pulse sequences. For instance, it significantly shortens the time needed to run spin-density and/or T2-weighted pulse sequences, without sacrifices in SNR.

According to one example, in order to maximize ARD efficiency, for GRE ARD: i.) the gradient waveforms are balanced at the time of the ARD feedback (i.e. $0^{th}$ gradient moment nulled along all gradient axes) and ii.) the ARD feedback is applied directly after the image data acquisition and subsequent balancing gradient waveforms. In this example the balancing gradient waveforms serve to refocus the signals at the time of the ARD feedback, by realigning and adjusting their phase.

For SE ARD an additional RF refocusing pulse is used and the ARD feedback is applied at the corresponding spin echo formation, with phase and gain of the refocused signals adjusted, and with the amplified and phased signal applied as a transmit feedback pulse. In this example the gradient waveforms are also balanced to refocus gradient-induced signal dephasing prior to the application of the ARD feedback around the spin echo formation.

In another example, the ARD system is based on a transmit-receive quadrature birdcage design with one of the two birdcage modes used for standard transmit/receive and the other mode used for ARD feedback. The inherent decoupling between the two quadrature modes minimizes direct, ARD transmit—receive interactions at ARD active time zones. The ARD feedback gain and phase are adjusted via voltage-controlled attenuators and phase shifters, activated by the main MRI pulse sequence.

In a further example, the ARD effect is applied in a volume-selective manner. This is achieved by adding slice selection gradients in a fashion similar to that used for standard slice selective RF excitation.

According to yet another example, the present system replaces RF and/or gradient spoiling with ARD, to rapidly convert transverse magnetization to longitudinal magnetization rather than spoiling it, and thus optimize SNR efficiency while preserving image quality. Hence the method can improve the SNR efficiency of pulse sequences that currently use spoilers, some by large amounts.

Further features include avoiding saturation regions, avoiding alternating signal levels in physiologically triggered sequences (myocardial perfusion imaging), and recovering longitudinal magnetization in hyperpolarized imaging.

The receiver section 250 includes one or more receivers depending on the imaging coil configuration. The acquired MR signals are processed to generate one or more images. The processing typically employs various reconstruction algorithms that suitably decode the spatially encoded magnetic resonance data. The reconstructed images can be stored, displayed, printed, or otherwise communicated for review and analysis.

Figure 3:
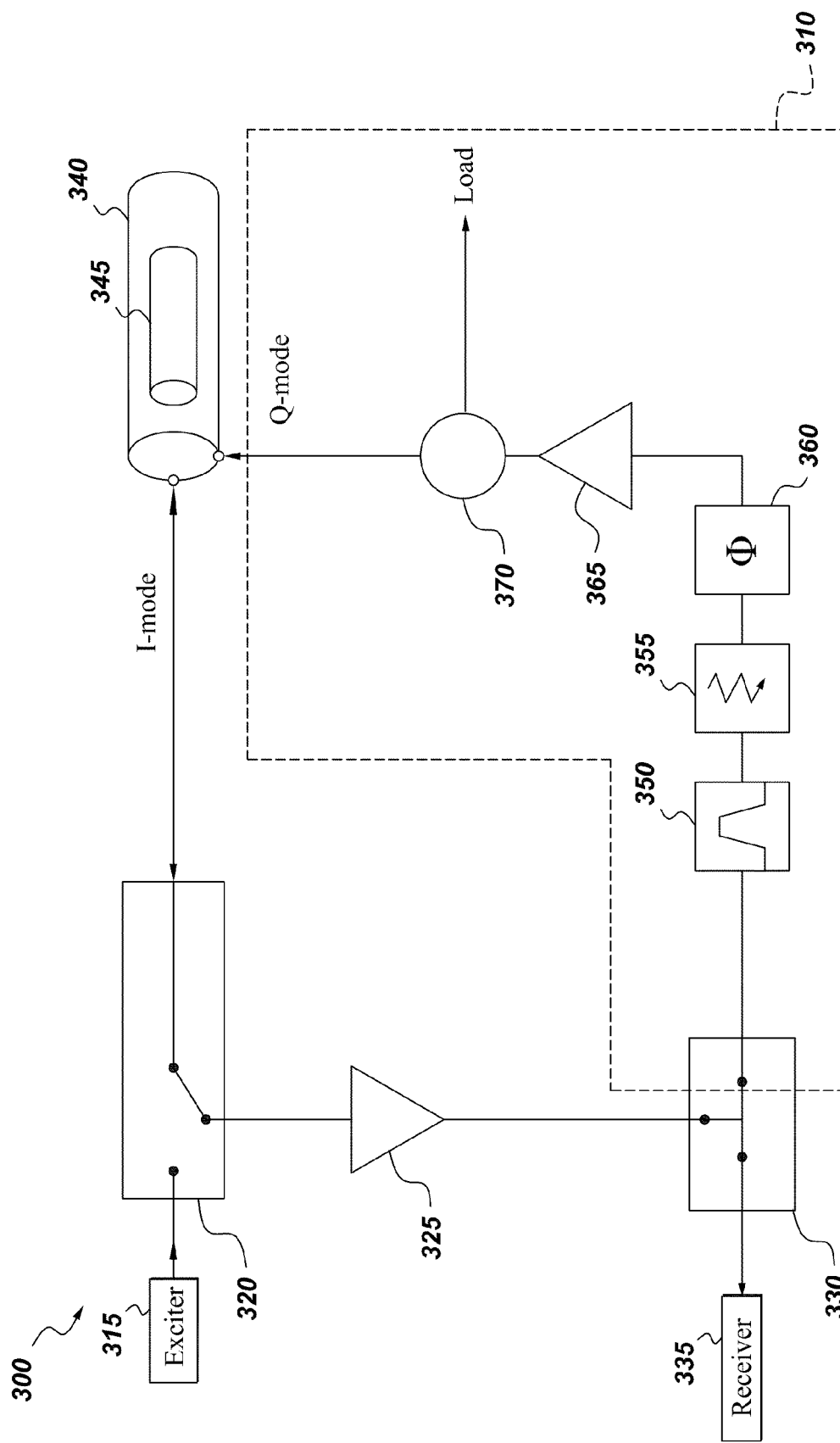
FIG. 3 illustrates a block diagram perspective for ARD using a quadrature birdcage coil according to one embodiment.

FIG. 3 illustrates one embodiment of the ARD feedback system 300, based on a quadrature birdcage coil 340 that operates with an I-mode (in-phase) signal and a Q-mode (quadrature-phase) signal upon a target or sample 345. One mode of operation is for standard transmit/receive (Tx/Rx) operation with another mode used for ARD feedback as provided by the ARD feedback circuit section 310. The inherent decoupling between the two modes minimizes direct ARD transmit and receive interactions thereby improving performance. The functionality is similar to the system of FIG. 2, with further detail as provided herein.

In the standard excitation mode of operation, the exciter 315 generates the excitation spatially encoded MR signal that goes through the transmit/receive (T/R) switch 320. According to one embodiment, the T/R switch 320 is switched so that the signal from the exciter 315 is an input to the quadrature birdcage coil 340 that operates on the target also referred to as sample 345 as detailed herein. Following the excitation pulse, the switch 320 is switched to disconnect the exciter 315 and coupled so that the coil 340 operates as an imaging coil to provide acquired MR image data to the receiver 335.

The I-mode signal from the quadrature birdcage coil 340 goes through the switch 320 and into the low noise amplifier (LNA) preamplifier 325 to boost the signal quality. Filtering at this stage is optional and may be used to remove extraneous signals. The boosted signal in one example is then an input to a splitter 330. Alternatively, the boosted signal can be an input to a switch (not shown) instead of the splitter 330. In certain applications the switch provides improved SNR efficiency as compared to the splitter 330.

In one example the Q-mode signal from the ARD Feedback 310 that is an input to the birdcage 340 is formed from the acquired MR signals from the quadrature birdcage coil 340 and taken from the switch 330. The MR signal is filtered, such as by a bandpass filter 350, wherein the filtered signal is attenuated by the attenuator 355 and shifted by the phase shifter 360. The phase-shifted signal is amplified by the ARD amplifier 365 that is then subject to a circulator 370 that provides the amplified signal to the quadrature birdcage coil 340 as the Q-mode ARD feedback signal. The quadrature birdcage coil 340 processes the sample 345 employing the I-mode T/R signal with the Q-mode ARD feedback signal. It should be understood that the filtering, attenuating, phase-shifting and amplification of the ARD feedback section 310 are optional aspects and other embodiments and permutations of the elements are within the scope of the system.

While the narrow pass-band filter 350 is optional, it serves to improve the stability of the RF feedback. The ARD amplifier 365 provides an overall amplification of the feedback signal for the birdcage coil 340. Alternatively, also the standard RF system amplifier can be used to amplify the RD feedback signal. In this embodiment the feedback gain and phase are adjusted via a voltage-controlled attenuator 355 and phase shifter 360 respectively. The voltage-controlled attenuator 355 and phase shifter 360 are applied for flexible adjustment of the ARD feedback gain and phase.

The circulator 370 absorbs some of the reflected power coming back from the quadrature birdcage 340. The homogeneous transmit and receive sensitivity profiles of a birdcage coil 340 results in coherent in-phase excitation and signal detection. This produces a high filling factor and hence a desired, high input receive signal for driving the ARD feedback. It is noted that different coils can be used for ARD and standard excitation and signal detection. For instance, image data acquisition can be performed using an anatomically tailored phased array together with an analog phase-sensitive signal combination.

The ARD effect can be understood as a self-consistent flip-back pulse. Using a feedback loop, ARD is time-selectively activated at certain time periods within the pulse sequence. The ARD can thus be turned on and off at any desired point(s) in the pulse sequence under pulse sequence control. As such, ARD constitutes a building block that can be flexibly incorporated into MR imaging and spectroscopy pulse sequences. In certain examples, the ARD can be employed automatically at given intervals or based upon some trigger event such as some measurements or manual selection such as by an operator.

Figure 4A:
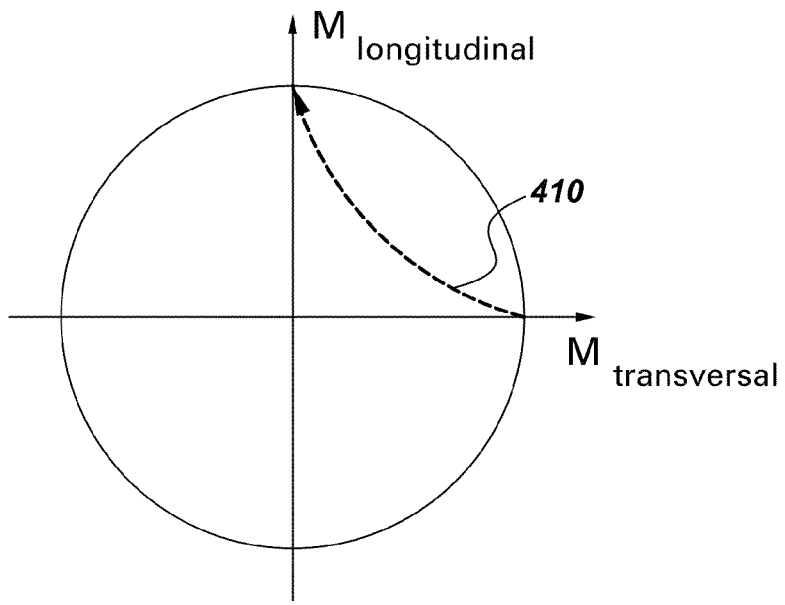
FIGS. 4a and 4b compare standard relaxation (FIG. 4a) and accelerated signal recovery using ARD feedback (FIG. 4b)
Figure 4B:
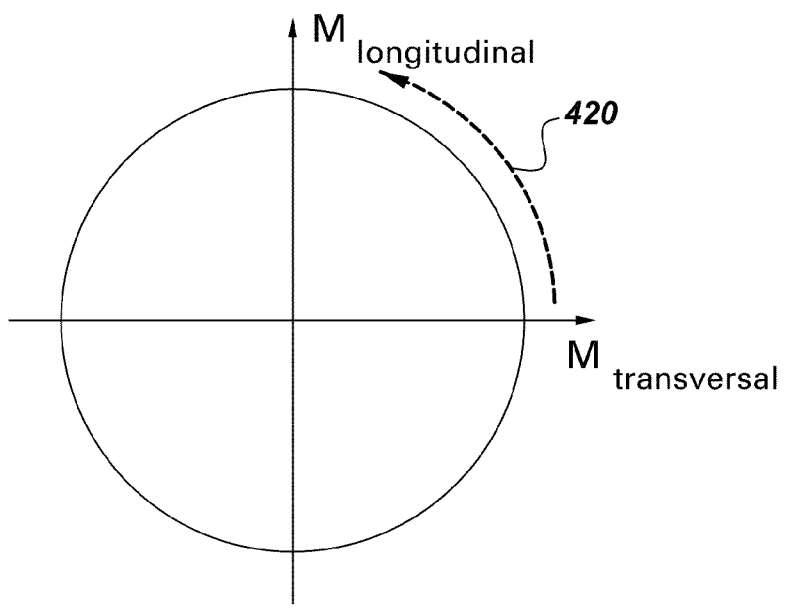

FIG. 4a illustrates the typical MR signal relaxation 410, with fast signal decay due to T2* relaxation (T2*~10 ms) and slow magnetization build-up or recovery due to T1 relaxation (T1~1 s). This typically requires either long repetition times and/or small flip angle excitation schemes to avoid saturation of the signal. Using ARD feedback such as shown in FIG. 4b results in accelerated signal recovery 420. The T1 relaxation is short cut via ARD acting as a self-generated and self-regulating signal recovery mechanism. This allows the use of shorter repetition times together with higher flip angles, resulting in higher SNR efficiency.

FIG. 5a shows a standard gradient-echo (GRE) pulse sequence having an excitation pulse 505 followed by data acquisition (DAQ) 510 for a give repetition time TR 530. FIG. 5b, shows the modification for ARD, which requires the application of an ARD feedback pulse (RD) 520 after data acquisition (DAQ) 510 is finished. In order to maximize the receive signal, which forms the input for the ARD feedback, gradient waveforms in one example are balanced (i.e. $^{0th}$gradient moment equals zero for all axes) at RD-active time periods. The SNR efficiency and off-resonance sensitivity improves for shorter time intervals between the RF excitation and the ARD feedback pulse.

FIGS. 6a and 6b shows Bloch simulation results comparing the steady-state signal response between GRE ARD and steady-state free-precession (SSFP) imaging in one example. The flip angle (FA) and the repetition (TR) of the RF excitation pulse 610 were assumed to be 60° and 10 ms, respectively. In both cases balanced gradient waveforms and excitation phase cycling was assumed. The simulation results demonstrate similar off-resonance dependence but increased SNR efficiency for GRE ARD. Spoiling was found to result in a sharper off-resonance profile of similar intensity.

FIG. 6a illustrates the sequence timing (FA=±60°, TR=10 ms) for the RF excitation pulse 610 and the ARD feedback pulse 620 according to one example. For ARD, a time window of 3 ms (3 ms-6 ms) is allocated for data acquisition before the ARD feedback pulse is activated (6 ms-9 ms). In both cases balanced gradient waveforms and ±flip angle phase cycling is assumed.

FIG. 6b shows increased SNR and similar off-resonance dependence of the steady-state signal response for ARD. For the Bloch simulations T1 and T2 relaxation times of 500 ms and 100 ms were assumed, respectively. The ARD signal 630 and the SSFP signal 640 are depicted. The additional black line 650 indicates the steady-state signal response for a spoiled gradient echo (GRE) sequence with optimal Ernst flip angle excitation.

ARD can also be incorporated into a spin-echo (SE), fast-recovery type embodiment. For that purpose, an additional refocusing pulse is used and the ARD feedback pulse is then applied around the corresponding spin-echo such as shown in FIG. 7b. The refocusing pulse prior to the flip back pulse refocuses $B_0$ and chemical shift off-resonance and introduces additional T2 weighting.

In FIG. 7a, the spin-echo (SE) fast recovery shows an additional refocusing pulse together with a flip-back RF pulse 710 that is applied at the corresponding echo to restore remaining transverse magnetization in the SE fast recovery period 720. Referring to FIG. 7b, in SE ARD the flip-back RF pulse is replaced by an ARD feedback pulse 730 showing the SE ARD period 740.

In one example, an ARD feedback circuit based on a quadrature birdcage coil was designed and connected to a 1.5 T GE Signa HDx MR scanner (GE Healthcare, Waukesha, Wis., USA). A setup with a high filling factor was chosen by using a cylindrical birdcage coil (diameter=12 cm, length=30 cm) in combination with a tight-fitting cylindrical water phantom (diameter=9 cm, length=18 cm). The T1 relaxation time of the $CuSO_4$-dopped water phantom was measured to be ~200 ms. For this setup, the natural radiation damping time constant was roughly estimated as ~250 ms.

Figure 8:
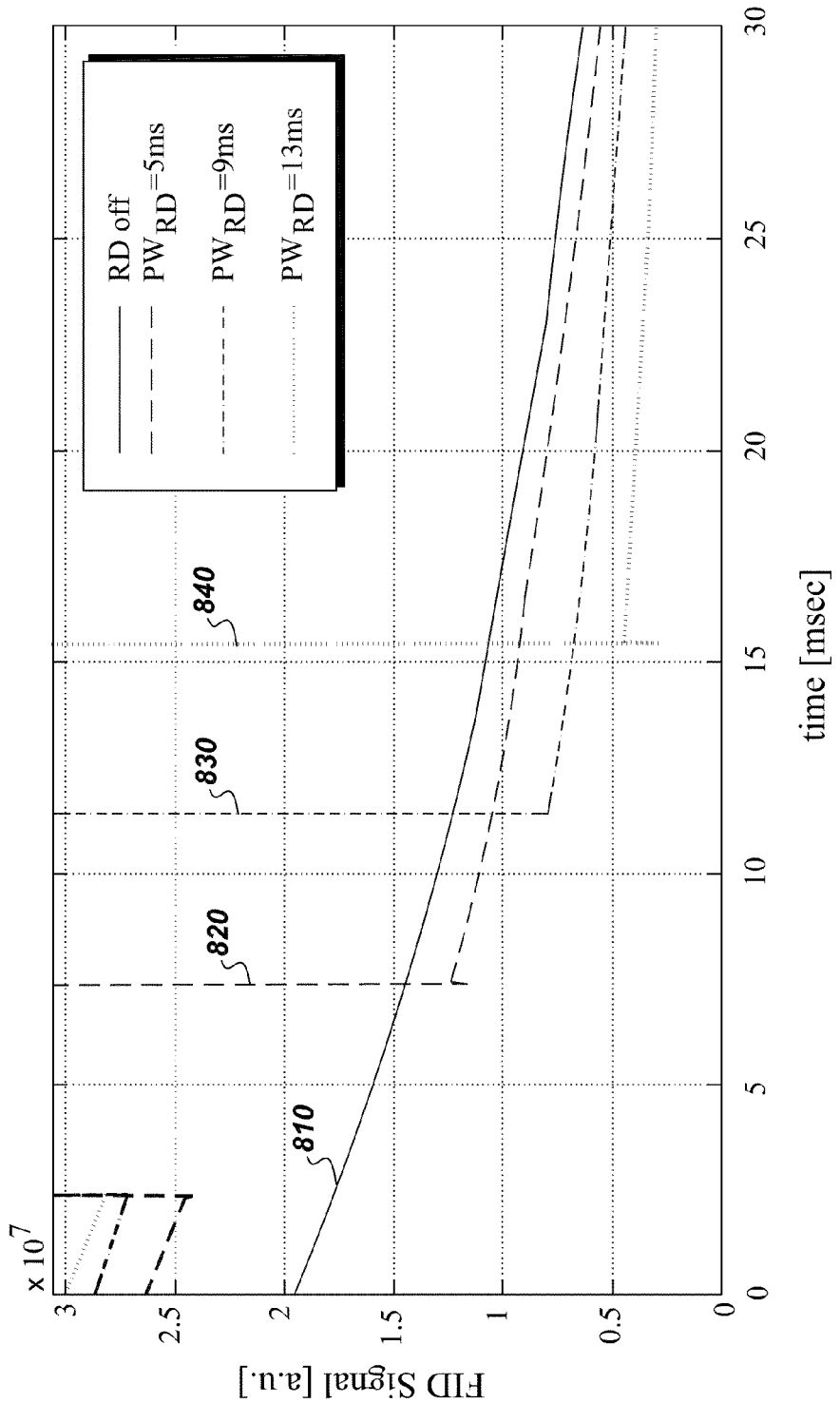
FIG. 8 shows the FID signal over time for various ARD feedback durations ($PW_{RD}$)

Referring to FIG. 8, FID signal curves are shown with and without ARD for short TR (35 ms), 90°, non-volume-selective FID acquisitions. ARD feedback of different pulse widths ($PW_{RD}$) starting 2.4 ms after start of data acquisition was applied. Compared to a standard FID without ARD, two effects are observed with increasing $PW_{RD}$: i.) the FID signal after the ARD pulse decreases, and ii.) the initial FID signal increases. Both effects are consistent with the desired ARD signal enhancement. The signals illustrate ARD off (810); $PW_{RD}$=5 ms (820); $PW_{RD}$=9 ms (830); and $PW_{RD}$=13 ms (840). FIG. 8 thus shows the impact of ARD. Transient effects were observed to converge after ~10 repetitions. The measurements shown were obtained under steady-state conditions following 100 dummy repetitions.

In sum, with respect to standard FID without ARD 810 two effects can be observed: i.) the FID signal after ARD decreases with increasing ARD pulse width ($PW_{RD}$), corresponding to accelerated recovery of transverse magnetization towards the longitudinal direction and ii.) the initial FID signal increases with increasing $PW_{RD}$, corresponding to increased steady-state longitudinal magnetization. The ARD feedback gain and phase were manually tuned in prescan-mode by maximizing the initial FID amplitude.

Figure 9:
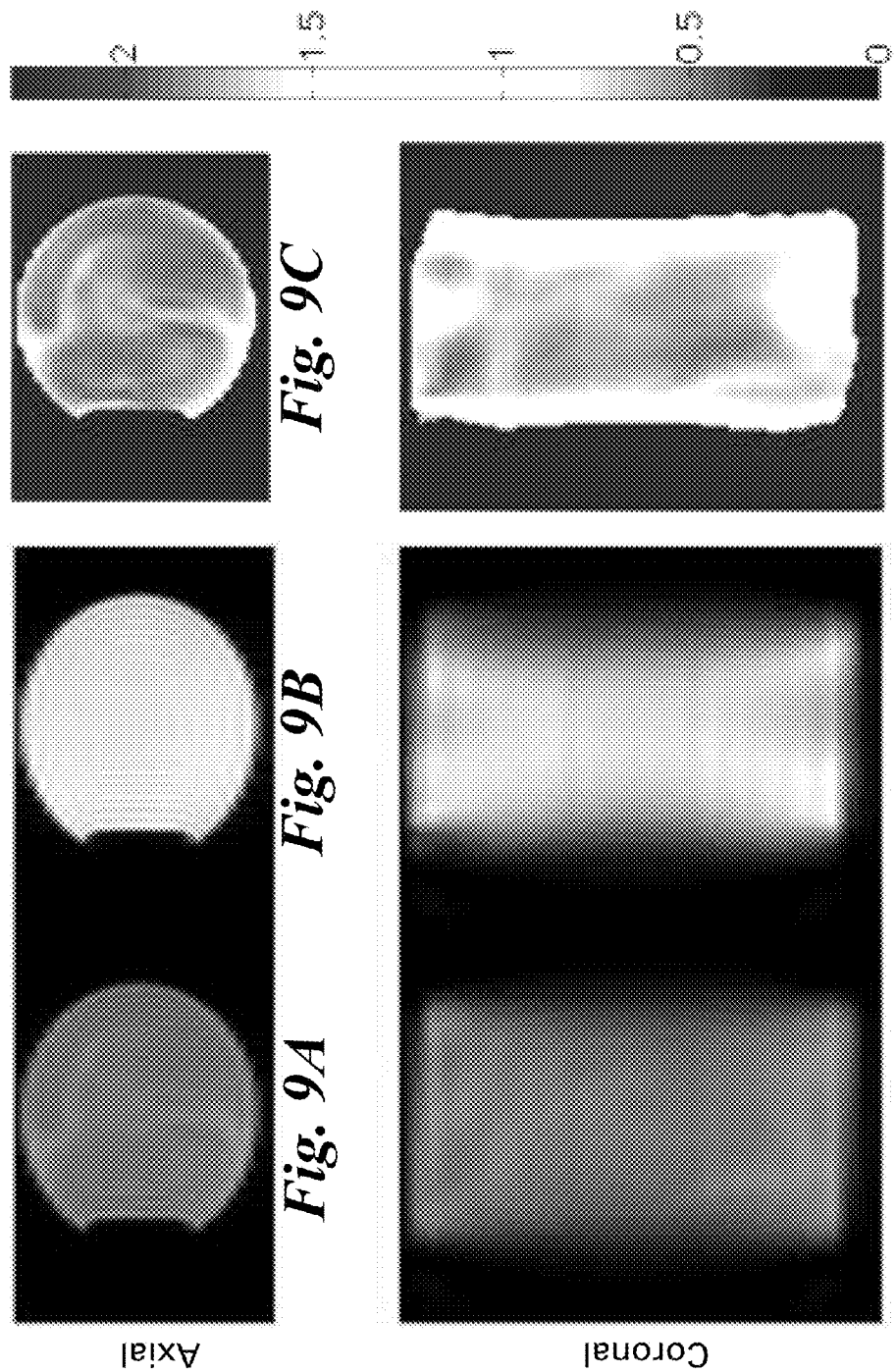
FIG. 9a-9f illustrate the increased SNR efficiency for gradient-echo ARD when compared with standard GRE imaging.

FIG. 9a-9f illustrate 3D GRE imaging results using a short T1 phantom (T1~200 ms) in combination with the quadrature birdcage RD feedback scheme shown in FIG. 3. The ARD feedback module was incorporated into a 3-dimensional GRE imaging pulse sequence such as illustrated in FIG. 5. The repetition time, flip angle and ARD pulse width were adjusted to be TR=35 ms, FA=90°, and $RD_{PW}$=13 ms, respectively. The ARD feedback was turned on after image data acquisition was finished approximately 5.5 ms after the RF excitation. Transient effects were avoided by applying twenty steady-state dummy repetitions. FIG. 9a-9c shows corresponding measurement results for central axial images and coronal slice orientations are shown in FIG. 9d-9f. The images on FIG. 9a and FIG. 9d are without ARD as compared to the images of FIG. 9b and FIG. 9e, which show enhanced SNR obtained using ARD. The corresponding enhancement factors are mapped in FIG. 9c and FIG. 9f. With standard $B_0$ auto-shimming applied, a relatively homogeneous signal enhancement factor of ~1.8 was found. Also, the off-resonance sensitivity and the SNR efficiency were found to improve with shorter timing delay between the RF excitation and the ARD feedback. Balanced gradient waveforms were found to be useful in order to obtain a sufficient receive signal for driving the ARD feedback.

Figure 10:
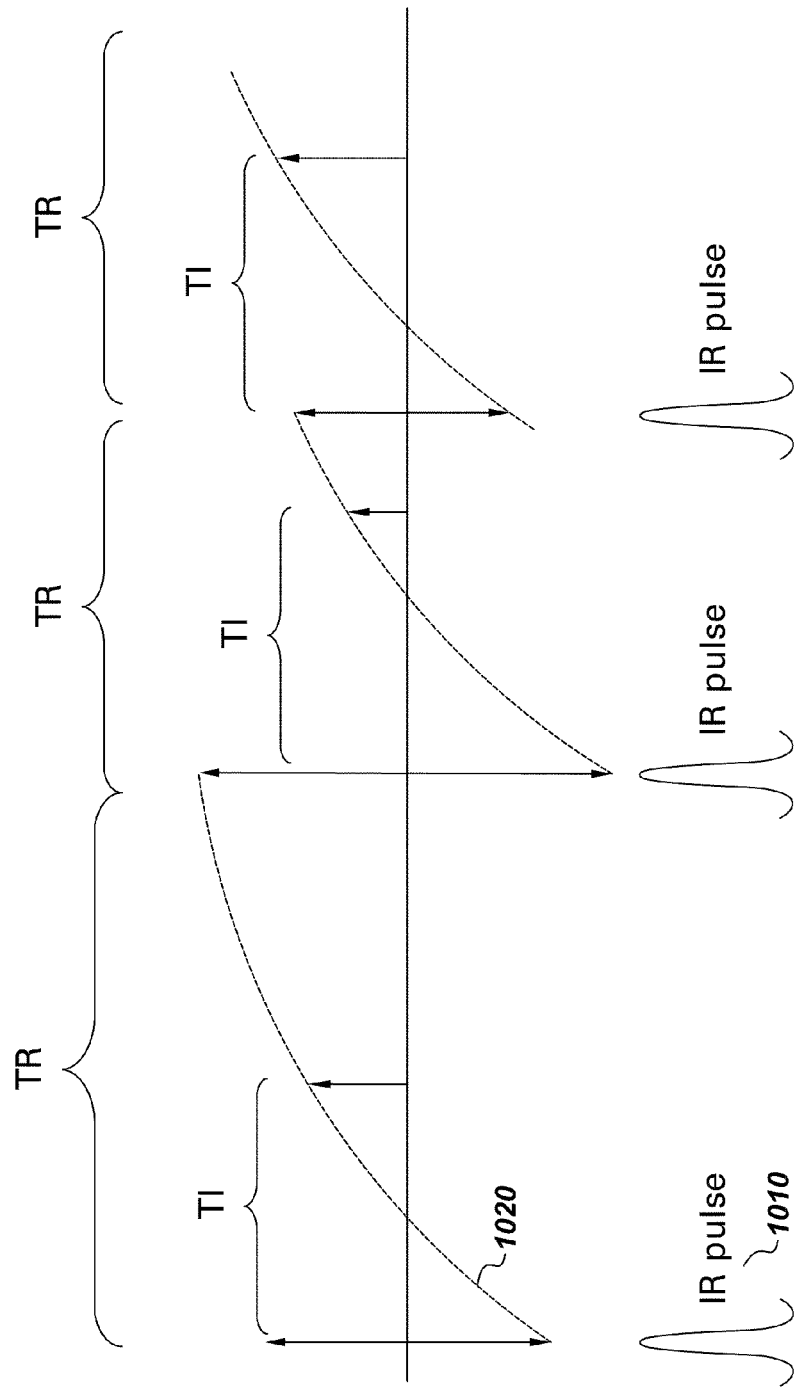
FIG. 10 illustrates the problem of varying steady-state in ECG-triggered inversion recovery pulse sequences due to TR variations caused by ECG irregularities.

Referring to FIG. 10, one application relates to a portion of a myocardial perfusion pulse sequence. Inversion (IR) pulses 1010 invert magnetization, which is then read out after a period TI (tuned to null the signal from myocardium in the absence of contrast agent). Repetition time TR is determined by cardiac triggering, which can be irregular, leading to uneven recovery of longitudinal magnetization, and thus variations in the signal 1020, from beat to beat can lead to ghosting in the images.

Figure 11:
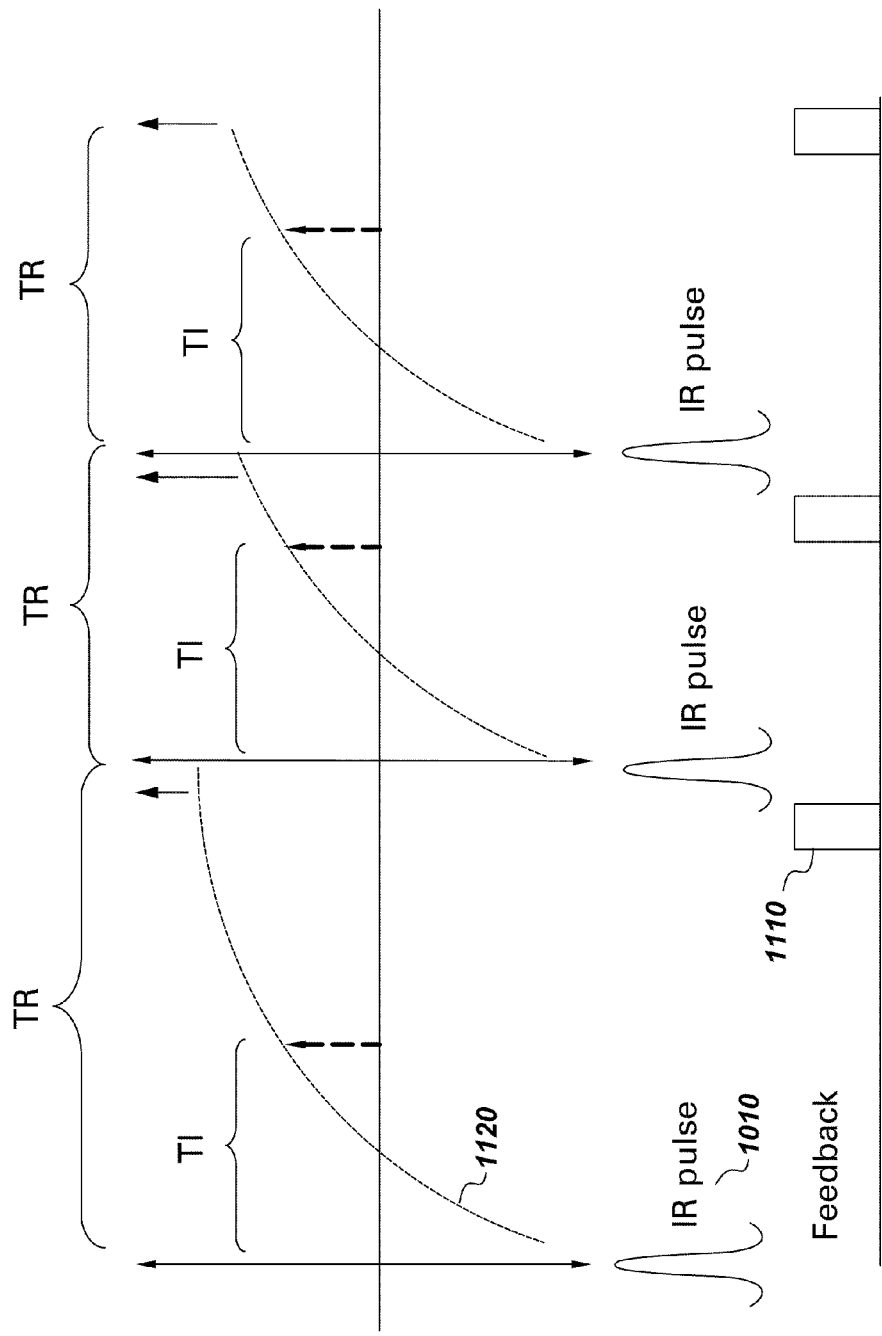
FIG. 11 shows how ARD signal recovery can help to provide a consistent steady-state also for varying TR, inversion-recovery pulse sequences.

FIG. 11 illustrates the same pulse sequence, with ARD activated after each data acquisition period with an ARD feedback signal 1110 that causes longitudinal magnetization to rapidly recover to its equilibrium value, leading to consistent signals 1120, independent of TR.

Figure 12:
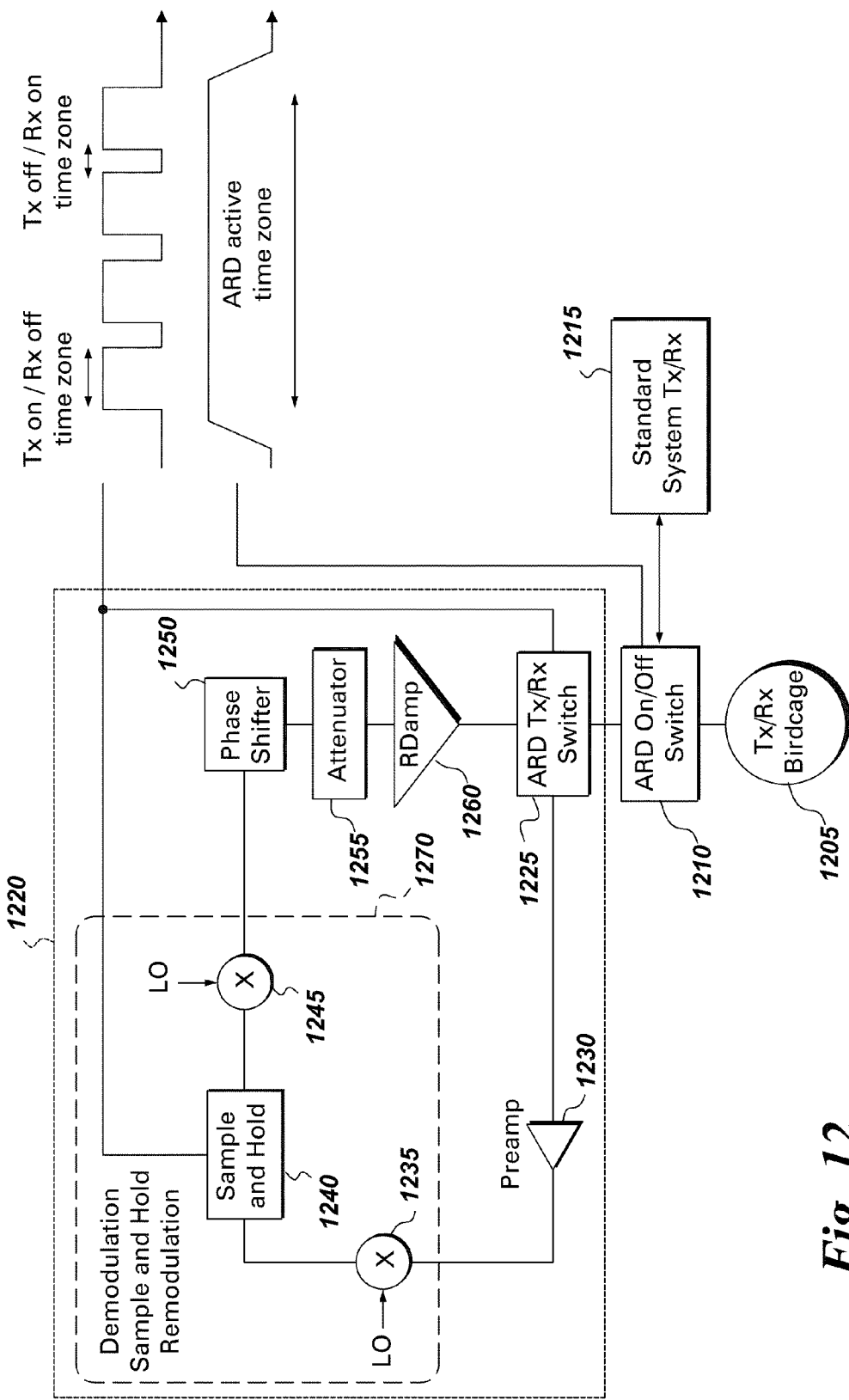
FIG. 12 is an illustration for the time-interleaved ARD feedback scheme according to one embodiment.

Referring to FIG. 12, another embodiment of ARD feedback circuitry is depicted. This embodiment seeks to time-separate the ARD receive and ARD transmit and helps to avoid direct ARD transmit—ARD receive interactions/coupling, which typically lead to instabilities and oscillations that may occur when the ARD feedback gain becomes higher than the intrinsic decoupling. The ARD feedback in one example includes radiation damping transmit and receive feedback intervals that are time-separated, using frequency conversion (down-conversion and up-conversion), sample-and-hold processing, and fast radiation damping transmit-receive switching.

The rapidly time-interleaved ARD feedback scheme of FIG. 12 functions in a similar fashion in some respects to the system of FIG. 3 but with additional features and processing. According to one embodiment, a volume transmit-receive coil 1205 receives signals from the standard transmitter/receiver system 1215 via an ARD on/off switch 1210 that connects the transmitter/receiver 1215 to the volume transmit-transmit receive coil 1205. The image response of a sample from the volume transmit-receive coil 1205 is then communicated back through the switch 1210 to the transmitter/receiver 1215 or to the ARD feedback section 1220. There may be additional amplification and/or filtering of the image signals from the volume transmit-receive coil 1205. In one embodiment a volume transmit-receive coil with somewhat uniform Tx/Rx profile is used. In one example the volume transmit-receive coil 1205 can be a birdcage coil.

The ARD switch 1210 is time-selectively engaged to invoke the ARD processing, wherein the switch 1210 can be activated upon various conditions such as, after every signal acquisition plus corresponding balancing gradients, at certain time intervals, certain measurements, or otherwise by user intervention. By way of example, the ARD switch 1210 can be turned 'On' under pulse sequence control such as at ARD active time zones or periods. Also during an ARD active time zone, an ARD transmit/receive switch 1225 is repeatedly switched on and off. One example of the timing is depicted with ARD Tx-on/Rx-off pulses alternating with ARD Tx-off/Rx-on pulses throughout the ARD active time zone. For illustrative purposes, in one example the ARD Tx-on/Rx-off pulse is about 100 microseconds and the ARD Tx-off/Rx-on pulse is about 16 microseconds, while the ARD active time zone can be a few milliseconds.

When the ARD feedback loop 1220 is activated, the received signals from the volume transmit-receive coil 1205 go through the ARD switch 1210 and through the ARD transmit/receive switch 1225. The signal is amplified by the preamplifier 1230 and there may be optional filtering. The amplified signal is then subject to a section for demodulation, sample and hold, and remodulation 1270. The frequency conversion is typically done to lower the signal frequency for sample and hold processing in the kHz range. The received signal in one embodiment is down-converted using a first mixer 1235 as a down-converter with a local oscillator signal to provide a lower frequency for the signal to be processed. Filtering after the down-conversion may also be applied. The down-converted signal is processed by a sample-and-hold section 1240 and then subject to an up-conversion via a second mixer 1245 acting as an upconverter. For improved feedback efficiency, the down-conversion, sample-and-hold and back up-conversion section 1270 in one embodiment is implemented in a quadrature fashion.

The up-converted signal goes through a phase shifter 1250, attenuator stage(s) 1255 and an ARD amplifier section 1260. The ARD amplified signal goes through the ARD transmit/receive switch 1225 and through the ARD on/off switch 1210 and back to the volume transmit-receive coil 1205. It is noted that the switching between ARD transmit and ARD receive is very fast with a switching frequency in the kHz range. Because ARD receive and ARD transmit happens at different times, this fundamentally eliminates the problem of ARD transmit—receive coupling, and hence enables higher feedback gains.

In another embodiment of the ARD feedback loop 1220, the signals are sampled by the sample-and-hold section 1240, stored or cached, and then played back for multiple time periods without having to sample again. The signals in one example are multiple sampled signals from within an ARD active time zone, and these signals can be replayed for a number of subsequent time periods without having to sample again. The replayed signals are fed back to the imaging target at approximately the same time after excitation in each sequence, thus the current state of spins at each of those times should be about the same. In one aspect, the stored signals should be approximately the same on each excitation subject and should be at the same or a similar phase encoding.

FIGS. 13a-f shows three-dimensional gradient echo (TR=50 ms, TE=2.5 ms, BW=125 kHz) measurement results of a grapefruit using the time-interleaved feedback circuit illustrated in FIG. 12. The experiments were performed using a 1.5 T GE HDx system (GE Healthcare, Waukesha, Wis.) and a quadrature transmit-receive birdcage head-coil (diameter=12 cm, length=30 cm). The sample and hold switching was adjusted to $\Delta f$=50 kHz. The ARD feedback was directly applied after the balancing gradients following the image data acquisition for a duration of 4 ms. The figure shows measurement results for 90° (FIG. 13a-c) and 33° Ernst angle (FIG. 13d-f) excitation. The columns contain images obtained without ARD feedback (FIGS. 13a and 13d) and with ARD feedback activated (FIGS. 13b and e). In this case, signal enhancement factors of up to 8 and 1.8 were found for 90° and Ernst angle excitation, respectively shown in FIGS. 13c and 13f. Besides boosting the steady-state signal response, the ARD feedback also enhances T2* and off-resonance contrast.

By nature, the ARD effect is not volume selective, and it acts on all spins within the sensitive region of the RF coil. For slice selective imaging, the ARD effect needs to be volume selective in order to be useful. This is achieved by applying a slice selection gradient simultaneous to the ARD feedback, similar to what is done for standard slice selective excitation.

The obtained results demonstrate the use ARD feedback to recover transverse magnetization into the longitudinal direction at a rate much faster than normal T1 relaxation. The resulting improved SNR efficiency in one aspect is useful for short TR-sequences with large flip-angle excitations and long T1 longitudinal relaxation times. The steady-state SNR efficiency and off-resonance sensitivity improve with shorter time intervals between the excitation and the ARD feedback pulse. In the limiting case of a short, intense ARD pulse immediately following the RF excitation close to 100% SNR efficiency and no off-resonance sensitivity is expected.

The inherent self-generating nature of ARD acts as a self-resonant excitation and might be advantageous to enhance off-resonance contrast. In order to maximize the NMR signal that drives the ARD feedback, the spins have been rephased following the image encoding using balanced gradient waveforms. The self-regulating nature also provides an important advantage in the sense that it turns itself off, once the magnetization has been recovered (i.e. no remaining net transverse magnetization). Placing the feedback circuitry under pulse sequence control allows precise control of the amplification, phasing and timing of the ARD feedback. Thus, the ability to control the strength, phase and timing of ARD is another feature contributing to its utility as a versatile building block for MR imaging and spectroscopy pulse sequences.

ARD is a general concept, which principally can be incorporated in MR imaging and spectroscopy pulse sequences. The following exemplifies a few applications where this method is useful.

One application is the use of ARD as a means for improving the efficiency of spoiling. Short-TR pulse sequences that employ multiple excitations on a time scale smaller than the T2 relaxation time generally use special gradient pulses (called "gradient spoiling") at the end of each signal read-out, to destroy any remaining transverse magnetization before the next excitation pulse is applied, and thus prevent coherences from building up from excitation to excitation. This prevents artifacts from appearing in the images.

Alternatively, the phase of the RF excitation pulses can be made pseudo-random (called "RF spoiling"). This has a similar effect of destroying any signal coherences before they can build up. However, by destroying coherences in the signal, available magnetization is wasted, and the SNR efficiency of the MRI pulse sequence is decreased. Instead, one embodiment is to first use ARD to recover remaining longitudinal magnetization, and to either skip spoiling or apply it only afterwards for the elimination of any remaining, undesired signal coherences.

Another application includes the use of ARD as a means for creating uniform signal recovery in physiologically-triggered sequences. Physiologic triggering (e.g. ECG and respiratory triggering) often results in an alternating signal response, which is caused by physiologic variations during the measurement. In such cases ARD can be applied to accelerate signal recovery and thus achieve a consistent signal response that is independent of physiologic variations.

According to one illustrative application of the ARD, cardiac MRI pulse sequences for assessment of myocardial perfusion rely on the use of saturation recovery rather than inversion pulses followed by signal read-out after some time, TI. This is because such sequences are ECG triggered and cardiac irregularities can cause variations in repetition time TR, and uneven recovery of longitudinal magnetization from beat to beat. This in turn leads to variability in the acquired signal and thus ghosting. Cardiac MRI pulse sequences (such as myocardial perfusion and myocardial viability sequences) often rely on the use of inversion pulses followed by signal read-out after some time TI to null the signal from myocardium in the absence of contrast agent. Because such sequences are triggered to the cardiac ECG to synchronize acquisition with cardiac motion, they are susceptible to irregularities in the ECG, which can cause variations in repetition time TR, and uneven recovery of longitudinal magnetization from beat to beat. This in turn leads to variability in the acquired signal and thus ghosting. Here ARD is used to rapidly return the longitudinal magnetization to its equilibrium value prior to the next inversion pulse, and thus ensure uniform signal levels independent of TR.

Saturation recovery magnetization preparation pulses are often used because the longitudinal magnetization then recovers from a fixed point (Mz=0). However, for optimal image SNR, inversion recovery magnetization recovery can also be used. If complete recovery of the longitudinal magnetization can be realized prior to the next magnetization preparation pulse, then inversion recovery can be used because the longitudinal magnetization can then recover from a fixed Mz=−Mo point independent of variations in the patient's heart rate.

In another application ARD is used as a means to achieve T2 and/or spin density contrast using short-TR sequences. Spin-echo (SE) pulse sequences (including fast-spin-echo, or FSE) are useful for generating MR images with T2 contrast. Similarly short echo time (TE) GRE, or SE sequences are used for generating proton density contrast. Both cases share the problem that long TR values are needed to allow recovery of the longitudinal magnetization before the next excitation pulse, resulting in low SNR efficiency. Here ARD can be used to drastically shorten TR, and yield a family of pulse sequences with high T2 and/or spin density contrast while maintaining high SNR efficiency.

A further application employs ARD as means for preventing saturation regions in hybrid pulse sequences. Hybrid MRI pulse sequences that rapidly switch (or interleave) between imaging different regions can suffer from saturation bands that appear in the images. For example, in three-plane localizers, dark bands corresponding to previously excited orthogonal scan planes can appear in subsequent scan planes. Here ARD can be used to rapidly restore the longitudinal magnetization to its equilibrium value, thus eliminating undesired saturation regions.

A further application uses ARD for hyperpolarized MR imaging and spectroscopy. Hyperpolarization techniques achieve signal enhancement factors (relative to thermal polarization) of several orders of magnitude. Because of its non-equilibrium nature, each signal excitation leads to an irreversible loss of the limited hyperpolarized signal pool. Using ARD allows recycling of transverse magnetization and hence a more efficient use of the limited hyperpolarized signal.

In certain embodiments, the system and methods focus on the aspect of using ARD to restore transverse magnetization into the longitudinal direction and hence to increase the SNR efficiency of MR imaging and spectroscopy pulse sequences. For that purpose the ARD feedback is selectively activated after image data acquisition is finished. This is fundamentally different from previously presented ARD feedback schemes, which have aimed at either trying to introduce additional off-resonance contrast, or applying ARD feedback following a non-selective saturation pulse prior to RF excitation and data acquisition. Other embodiments and structures are explained herein to accommodate other designs and applications. Also, and as demonstrated in FIG. 13a-f, using ARD feedback for signal recovery after image data acquisition improves the contrast behavior in the final images. Generally, ARD feedback can be applied also at multiple different time periods or zones within the pulse sequence to emphasize either signal to noise ratio and/or contrast behavior.

One cardiac application uses amplified radiation damping (ARD) after each signal acquisition, to rapidly return the longitudinal magnetization to its equilibrium value prior to the next inversion pulse, and thus insure uniform signal levels independent of cardiac R-R interval time (related to heart rate).

In myocardial viability imaging, where an inversion recovery magnetization pulse is used and the TI is selected to null normal myocardial tissue, each acquisition segment is acquired in two R-R intervals to allow more complete recovery of longitudinal magnetization. This is used for image contrast and image SNR. The use of amplified radiation damping accelerates the recovery of longitudinal magnetization, allowing a speed-up of image acquisition. This has been addressed in some cases by replacing inversion pulses with saturation pulses to insure the longitudinal magnetization is recovering from the same value from beat to beat. However, saturation recovery sequences have lower contrast and image signal-to-noise ratio than inversion recovery sequences.

Cardiac MRI pulse sequences (such as myocardial perfusion and myocardial viability sequences) often rely on the use of inversion pulses followed by signal read-out after some time TI to null the signal from myocardium in the absence of contrast agent. Because such sequences are triggered to the cardiac ECG to synchronize acquisition with cardiac motion, they are susceptible to irregularities in the ECG, which can cause variations in repetition time TR, and uneven recovery of longitudinal magnetization from beat to beat. This in turn leads to variability in the acquired signal and thus ghosting. One embodiment of the present system uses amplified radiation damping (ARD) after each signal acquisition, to rapidly return the longitudinal magnetization to its equilibrium value prior to the next inversion pulse, and thus insure uniform signal levels independent of TR.

Further examples for myocardial perfusion imaging include an inversion recovery magnetization preparation RF pulse used instead of a saturation recovery RF pulse. Another example includes an inversion recovery magnetization preparation RF pulse used with the result that the signal is insensitive to variations in the cardiac heart rate. The inversion recovery magnetization preparation RF pulse can be used to provide a signal that recovers from a fixed point (Mz=−Mo) following the magnetization preparation RF pulse, independent of variations in the cardiac heart rate. The inversion recovery magnetization preparation RF pulse in another example allows differentiation of normally perfused myocardial tissue and ischemic tissue by observing contrast differences at a time delay, TI, from the inversion recovery RF pulse. The inversion recovery magnetization preparation RF pulse can also be used with short acquisition times and yet realize full recovery of the longitudinal magnetization. Another example uses a single R-R interval for the acquisition of a segment of k-space data in which the longitudinal magnetization is fully recovered to its equilibrium value before the next magnetization preparation RF pulse.

With respect to myocardial viability imaging, an inversion recovery magnetization preparation RF pulse can be used and the full recovery of the longitudinal magnetization eliminates signal intensity variations due to changes in patient heart rates. An additional acquisition can be used at the end of the cardiac R-R interval (where the magnetization is fully recovered) to acquire a phase image. A second phase image is used to generate a phase-sensitive inversion recovery image for myocardial viability imaging in the same cardiac R-R interval. The second phase measurement image can be acquired in the same cardiac R-R interval as the primary myocardial viability imaging following the inversion recovery RF pulse, allowing faster image acquisition.

Another example is a single cardiac R-R interval used per ECG-gated k-space segment where a phase calibration image is also acquired in the same cardiac R-R interval rather than in two cardiac R-R intervals.

Activation of the feedback circuit with proper gain and phase over an appropriate length of time would rapidly return the longitudinal magnetization to its equilibrium value and thus insure uniform signals from beat to beat, eliminating ghosting. This improves the contrast-to-noise ratio of myocardial perfusion and viability imaging sequences, while eliminating ghosting and open the cardiology market to MR.

While only certain features of the invention have been illustrated and described herein, many modifications and changes will occur to those skilled in the art. It is, therefore, to be understood that the appended examples are intended to cover all such modifications and changes as fall within the true spirit of the system.

The invention claimed is:

1. An imaging system, comprising:
an imaging apparatus having a plurality of coils, wherein an imaging target is at least partially disposed proximate said coils;
at least one excitation source providing pulse sequences;
a switch switchably connecting the pulse sequences from said excitation source to said coils and switchably connecting to spatially encoded signals from said coils during data acquisition;
a feedback section time-selectively activated and providing amplified radiation damping feedback to the imaging target subsequent to said data acquisition, wherein the amplified radiation damping feedback provides recovery of longitudinal magnetization; and
a receiver section for processing the spatially encoded signals.

2. The system according to claim 1, wherein the spatially encoded signals pass to the receiver section without being subject to the feedback section processing during inactive periods, and the time-selectively activated amplified radiation damping feedback is active during active periods in the pulse sequences.

3. The system according to claim 1, wherein the pulse sequences comprise balanced gradient waveforms and the amplified radiation damping feedback is applied after the data acquisition and the balancing gradient waveforms.

4. The system according to claim 1, wherein the pulse sequences comprise at least one refocusing pulse, wherein the refocusing pulse and the amplified radiation damping feedback are applied at the corresponding echo formation.

5. The system according to claim 1, wherein the imaging apparatus is a transmit-receive quadrature birdcage coil, and wherein the amplified radiation damping feedback uses one quadrature mode for receive and another quadrature mode for transmit.

6. The system according to claim 1, wherein the time-selectively activated amplified radiation damping feedback is adjusted for gain and phase under pulse sequence control by voltage-controlled attenuators and phase shifters.

7. The system according to claim 1, wherein said time-selectively activated amplified radiation damping feedback is applied at multiple time periods within the pulse sequences.

8. The system according to claim 1, wherein the amplified radiation damping feedback is comprised of amplified radiation damping transmit and receive feedback intervals that are time-separated using frequency conversion, sample-and-hold and amplified radiation damping transmit-receive switching.

9. The system according to claim 1, wherein the feedback section comprises at least one filter, attenuator, phase-shifter, amplifier and circulator.

10. An imaging method using amplified radiation damping, comprising:
   providing excitation pulses to transmit coils in an imaging system;
   creating $B_1$ fields with the transmit coils to nutate a nuclear magnetization of a target and causing nuclei to precess;
   acquiring image signals of the target from receive coils during data acquisition;
   acquiring refocused signals of the target from the receive coils after data acquisition;
   processing the refocused signals and time-selectively applying amplified radiation damping feedback to the target, wherein the amplified radiation damping feedback provides for recovery of longitudinal magnetization after the data acquisition; and
   reconstructing images from the image signals.

11. The method according to claim 10, wherein said transmit coils and said receive coils are comprised of transmit-receive coils.

12. The method according to claim 10, wherein time-selectively applying amplified radiation damping feedback is performed at multiple time periods within a pulse sequence.

13. The method according to claim 10, further comprising adjusting phase and gain of the refocused signals, and applying the amplified and phase adjusted signal as a transmit feedback pulse.

14. The method according to claim 10, further comprising balancing gradient waveforms prior to applying the amplified radiation damping feedback.

15. The method according to claim 10, further comprising balancing the gradient waveforms and applying the amplified radiation damping feedback after the image data acquisition.

16. The method according to claim 10, further comprising applying a refocusing pulse followed by applying the amplified radiation damping feedback at the corresponding spin echo formation.

17. The method according to claim 10, wherein the imaging system is a transmit-receive quadrature birdcage, and wherein the amplified radiation damping feedback uses one quadrature mode for receive and another quadrature mode for transmit.

18. The method according to claim 10, further comprising applying the amplified radiation damping feedback in a volume-selective manner by adding slice selection gradients during the amplified radiation damping feedback.

19. The method according to claim 10, wherein the amplified radiation damping feedback provides for at least one of increasing a signal-to-noise ratio efficiency, generating T2 contrast with short repetition time sequences, generating spin-density contrast with short repetition time sequences, recycling transverse magnetization in hyperpolarized applications, and stabilizing signal variations in physiologically-triggered sequences.

20. The method according to claim 10, further comprising applying amplified radiation damping feedback after each signal acquisition, to rapidly return longitudinal magnetization to its equilibrium value.

21. The method according to claim 10, further comprising reapplying a prior amplified radiation damping feedback for subsequent time periods.

* * * * *